(12) United States Patent

Myers et al.

(10) Patent No.: US 12,641,742 B1

(45) Date of Patent: May 26, 2026

(54) BRACKET SYSTEM FOR EQUIPMENT RACK CABLE ARCHITECTURE

(71) Applicant: National Technology & Engineering Solutions of Sandia, LLC, Albuquerque, NM (US)

(72) Inventors: Devan K. Myers, Albuquerque, NM (US); Jason Ryan Brelsford, Tijeras, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 18/543,442

(22) Filed: Dec. 18, 2023

(51) Int. Cl.
*H05K 7/02* (2006.01)
*H02G 3/04* (2006.01)

(52) U.S. Cl.
CPC ............. *H05K 7/02* (2013.01); *H02G 3/0456* (2013.01)

(58) Field of Classification Search
CPC ........... H02G 3/0456; H02G 3/04; H05K 7/02
See application file for complete search history.

(56) References Cited

U.S. PATENT DOCUMENTS

| | | | | |
|---|---|---|---|---|
| 4,860,168 A | * | 8/1989 | Wiljanen | H02G 3/0493 |
| | | | | 361/825 |
| 5,911,231 A | * | 6/1999 | Turner | B60S 3/002 |
| | | | | 134/201 |
| 5,969,292 A | * | 10/1999 | Snider, Jr. | H02G 3/0443 |
| | | | | 174/95 |
| 6,365,830 B1 | * | 4/2002 | Snider, Jr. | H04Q 1/06 |
| | | | | 174/95 |
| 7,601,922 B2 | * | 10/2009 | Larsen | F16L 3/26 |
| | | | | 174/72 A |
| 7,763,800 B2 | * | 7/2010 | Lesniak | H02G 3/30 |
| | | | | 174/72 A |
| 8,193,448 B2 | * | 6/2012 | Syed | H05K 7/1491 |
| | | | | 174/99 R |
| 10,212,851 B2 | * | 2/2019 | Rimler | H05K 7/20745 |
| 10,238,008 B2 | * | 3/2019 | Gosselin | H05K 7/20745 |
| 10,334,748 B1 | * | 6/2019 | Kostenko | H05K 7/026 |
| 11,228,166 B1 | * | 1/2022 | Rampey | F16L 3/26 |
| 2008/0023212 A1 | * | 1/2008 | Larsen | H02G 3/0443 |
| | | | | 174/101 |

FOREIGN PATENT DOCUMENTS

WO      WO-2012104545 A1 * 8/2012   .......... H02G 3/0443

* cited by examiner

*Primary Examiner* — Stanton L Krycinski
(74) *Attorney, Agent, or Firm* — Merle W. Richman

(57) ABSTRACT

A bracket system for use in a system including a moveable component or equipment rack receiving one or more cables via a cable tray above the component rack, the bracket system sized to offset from the cable tray vertically from the component rack. The bracket system including a lower interface for engaging the component rack and an upper interface for engaging the cable tray, where the interface(s) may be releasably coupled to the component rack and the cable tray to enable movement of the component rack when desired in an embodiment.

18 Claims, 12 Drawing Sheets

10

10

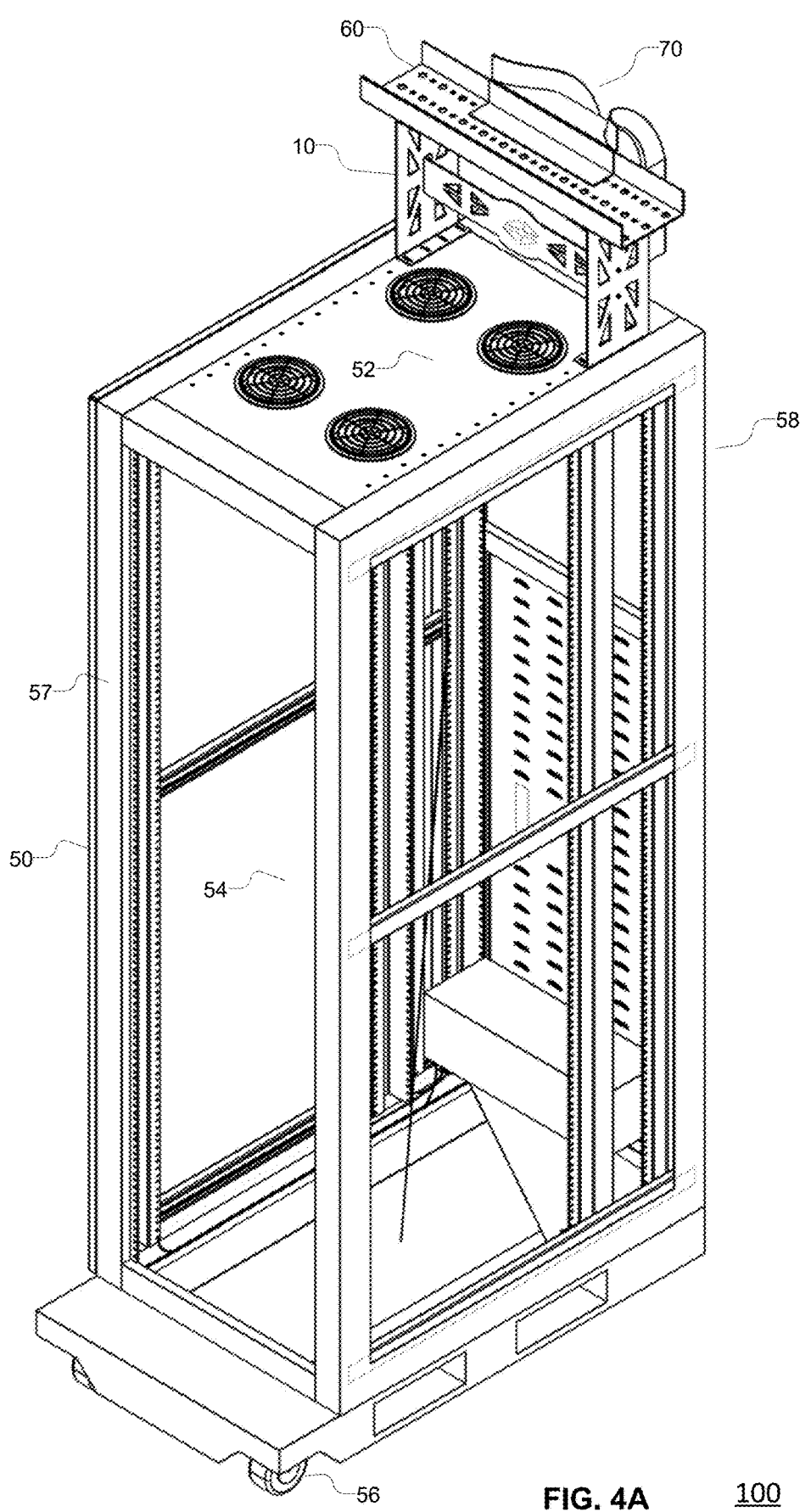
FIG. 4A     100

70

60

10

52

50

54

100

56

100

100

100

90

200A

200B

BRACKET SYSTEM FOR EQUIPMENT RACK CABLE ARCHITECTURE

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to component or equipment racks receiving one or more cables via a cable tray.

BACKGROUND

In component or equipment racks receiving one or more cables via a cable tray or rail, it may be desirable to be able to move the rack for maintenance with limited interaction with the cable tray. The present invention provides a system and a method to enable movement of a rack receiving one or more cables from a cable tray in an embodiment.

SUMMARY

The invention includes a bracket system that enables movement of a component rack coupled to one or more cables routed thereto via a cable tray. In an embodiment, the moveable component or equipment rack may receive one or more cables routed by a cable tray above the component rack. In an embodiment, the bracket system may be sized to offset the cable tray vertically from the component rack. The bracket system may include a lower interface couplable to the component rack and an upper interface couplable to the cable tray, where one of interface(s) may be releasably couplable to enable movement of the component rack when desired in an embodiment.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 4A is a simplified isometric view of a cabling support architecture including a bracket system in accordance with one or more embodiments of the present invention.

DETAILED DESCRIPTION

Component/equipment racks are commonly employed to store several signal and data processing components, such as servers, signal analyzers, signal amplifiers, and other data processing components. The components are built/sized with uniform shapes (rectangular with similar widths, maximum lengths, and heights (or integer multiples of a minimum height, for example)). Such uniform components may be stored/installed in slots of component racks having uniform openings (width and depth). The component racks themselves may have uniform overall heights, widths, and depths to enable multiple component racks to be aligned in rows such as component racks in server farms storing servers for example. Components installed in such racks may require power and the ability to communicate signals (electrical, optical in an embodiment) that could represent digital or analog (or combinations thereof) to other components in the same rack, other racks in the row, area, or other signal communications devices.

Power and signal communication for components in racks may be achieved via cables routed to the components in a rack. To organize the routing of cables to components in racks, cables may be routed to a similar area of each rack and from a similar location. For example, cables for components in a rack may be routed to the rear of the rack from above the rack. To further organize the cable routing, cable trays or rail may be employed to route cables and may include openings to direct cables to particular racks. Another component may be coupled to a cable tray to direct cables to a particular location of the rack (such as top, rear area) including "waterfalls".

Racks may further include patch panels where such cables external to the rack (routed to the rack via the cable tray) are coupled. Components within the rack may have cables that are coupled internally to the patch panel. In such a configuration, the patch panel may electrically or optically link coupled internal cables to coupled external cables (one to one). The use of cabling routing members (cable trays and waterfalls) and patch panels may enable component rack with installed components to be more easily removed from a location including from between other racks. In such configurations, the cable tray may be coupled to component rack(s), requiring a decoupling prior to rack removal or movement.

Figure 1A:
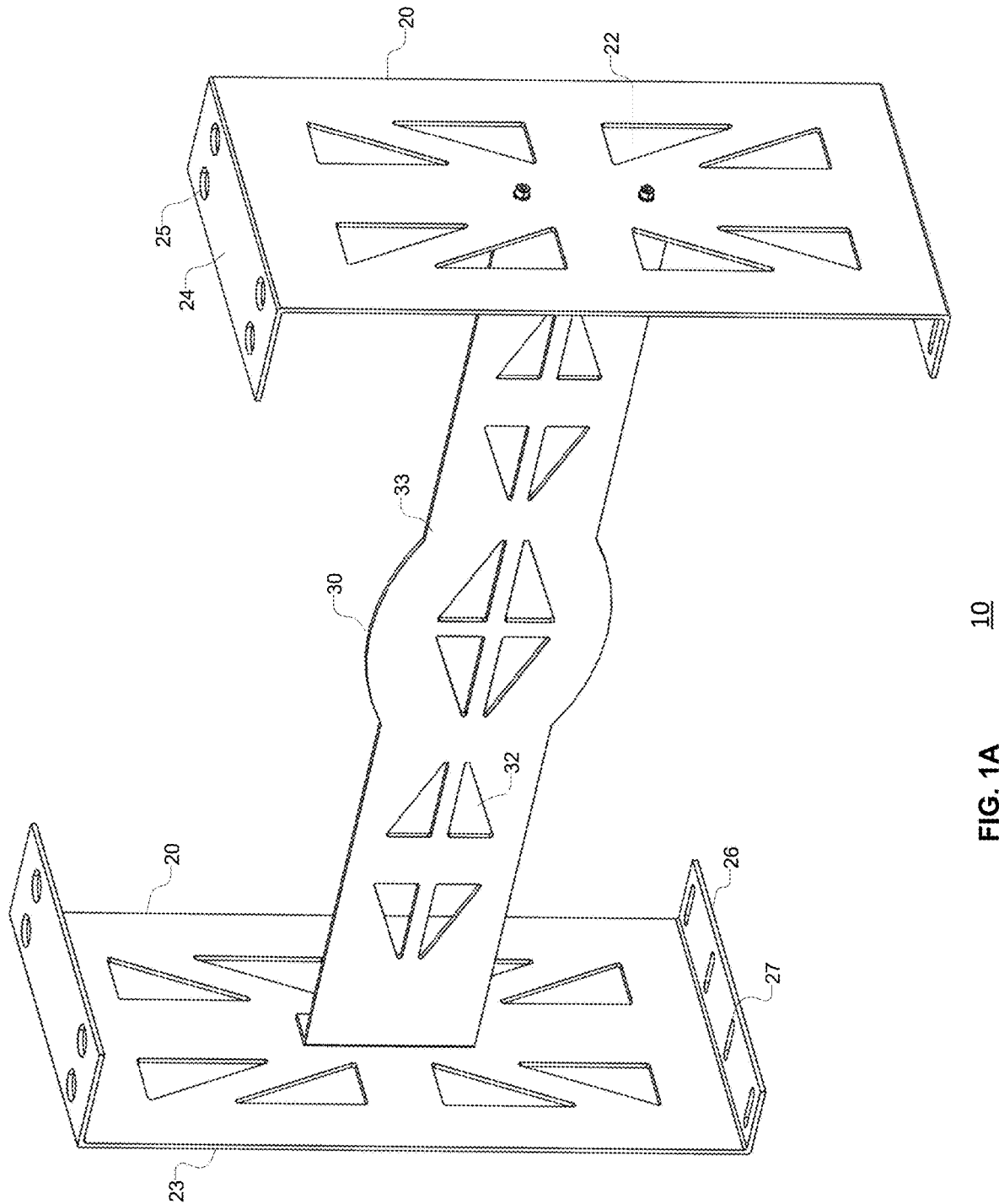
FIG. 1A is a simplified isometric view of a bracket system in accordance with one or more embodiments of the present invention.
Figure 1B:
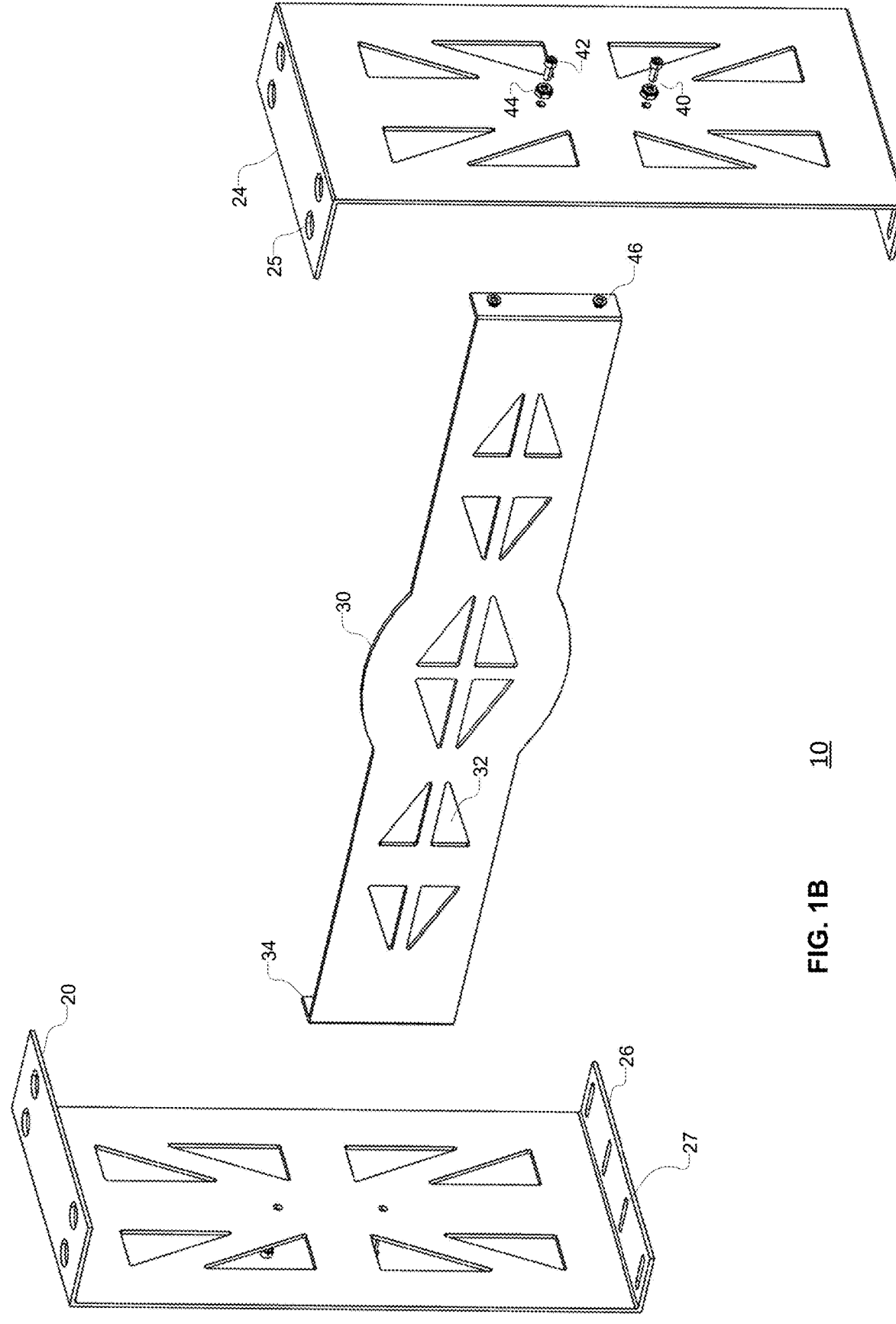
FIG. 1B is a simplified exploded isometric view of a bracket system in accordance with one or more embodiments of the present invention.

To further ease of movement of a component rack when desired, the bracket system 10 shown in FIG. 1A may be employed between a component rack and cable tray in an embodiment (as shown in FIGS. 4A-4F, 6A, and 6B). FIG. 1A is a simplified isometric view and FIG. 1B is a simplified exploded isometric view of a bracket system 10 in accordance with one or more embodiments of the present invention. As shown in FIGS. 1A and 1B, the bracket system 10 may include two vertical supports (left and right) or arms 20 coupled to a cross member 30 (or horizontal component) via linkage (coupling mechanism) 40. In an embodiment, the arms 20 may be coupled to the cross member 30 arm interfaces 34 via fasteners including mechanical elements (bolts 42, nuts 44, and washers 46) or non-mechanical means including welding or glues.

In an embodiment, the bracket system 10 vertical supports or arms 20 are shaped and sized to both engage and separate a component rack 50 from a cable tray 60. In an embodiment, the bracket system 10 is sized and shaped to vertically separate and engage a top section 52 of a component rack from a bottom 68 of a cable tray 60 (see FIGS. 4A-4F, 6A, and 6B). In an embodiment, the bracket system 10 vertical supports/arms 20 may include interface elements 24, 26 configured to engage a component rack 50 and a cable tray 60. In an embodiment, the bracket system 10 vertical supports/arms 20 elements or interfaces 24, 26 may securely engage/couple a component rack 50 and a cable tray 60 via linkage elements 40. In an embodiment, the bracket system 10 vertical supports/arms 20 interfaces 24, 26 may also securely and releasably engage/couple a component rack 50 and a cable tray 60 via a releasable linkage (90 FIG. 5).

Figures 2A, 2B, 2C, 2D:
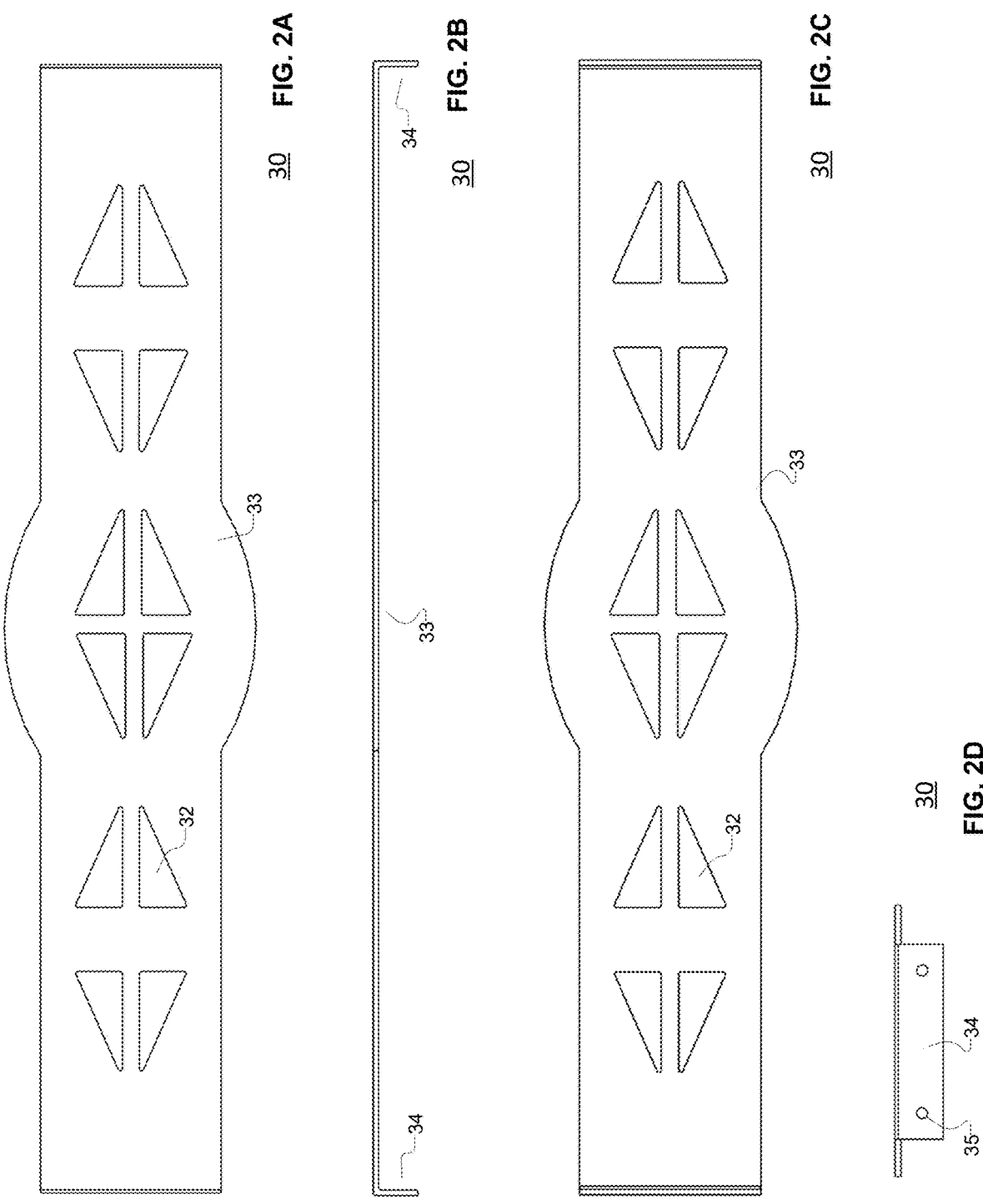
FIG. 2A is a simplified front view of a cross member of a bracket system in accordance with one or more embodiments of the present invention.
FIG. 2B is a simplified top view of a cross member of a bracket system in accordance with one or more embodiments of the present invention.
FIG. 2C is a simplified back view of a cross member of a bracket system in accordance with one or more embodiments of the present invention.
FIG. 2D is a simplified side view of a cross member of a bracket system in accordance with one or more embodiments of the present invention.

FIGS. 2A-2D are simplified views of a cross member 30 of a bracket system 10 in various embodiments. FIG. 2A is a simplified front view of a cross member 30 of a bracket system 10. FIG. 2B is a simplified top view of a cross member 30 of a bracket system 10. FIG. 2C is a simplified back view of a cross member 30 of a bracket system 10 in accordance with one or more embodiments of the present invention. FIG. 2D is a simplified side view of a cross member 30 of a bracket system 10 in accordance with one or more embodiments of the present invention. As shown in FIGS. 2A-2D, the cross member (or horizontal support) 30 may have a substantially elongated rectangularly shaped body 33 with a narrow width (as shown in FIG. 2B).

As shown in FIGS. 2B and 2D, the cross member 30 includes interface arms 34 with fenestrations 35 that form interfaces to engage vertical supports 20. As shown in FIGS. 2B and 2D, the arms 34 form a 90-degree angle with the cross member elongated body 33 in an embodiment so the vertical arms 20 are orthogonal to the cross member 30 when engaged thereto to form the bracket system 10. As shown in FIGS. 2A and 2C, the cross member 30 body 33 may include several large perforations 32. In an embodiment, the perforations 32 serve several functions including enabling the cross member 30 to twist within tolerances, permit increased airflow through the supports 20 and cross member 30, and provide visualization of elements, including cables around the cross member 30 when in use. Due to varying tolerances in and configurations of component racks 50 and cable trays 60, the vertical supports 20 and cross member 30 may have limited flexibility.

The length and height of the cross member 30 may vary depending on the component rack 50 and cable tray 60 to be engaged. In an embodiment, the cross member may have a length (along the body 33) of 18 inches, and height (vertical component of body 33) of 3 inches and thickness of 0.090 inches. In an embodiment, the cross member 30 and vertical supports 20 may be formed from aluminum sheet material having a thickness of 0.090 inches. In an embodiment, the vertical supports 20 and cross member 30 may be formed of any at least semi rigid, or rigid material including metals, alloys, ceramics, and polymers. FIGS. 3A-3E are simplified views of a vertical support 20 of a bracket system 10 in various embodiment.

Figures 3A, 3B, 3C, 3D, 3E:
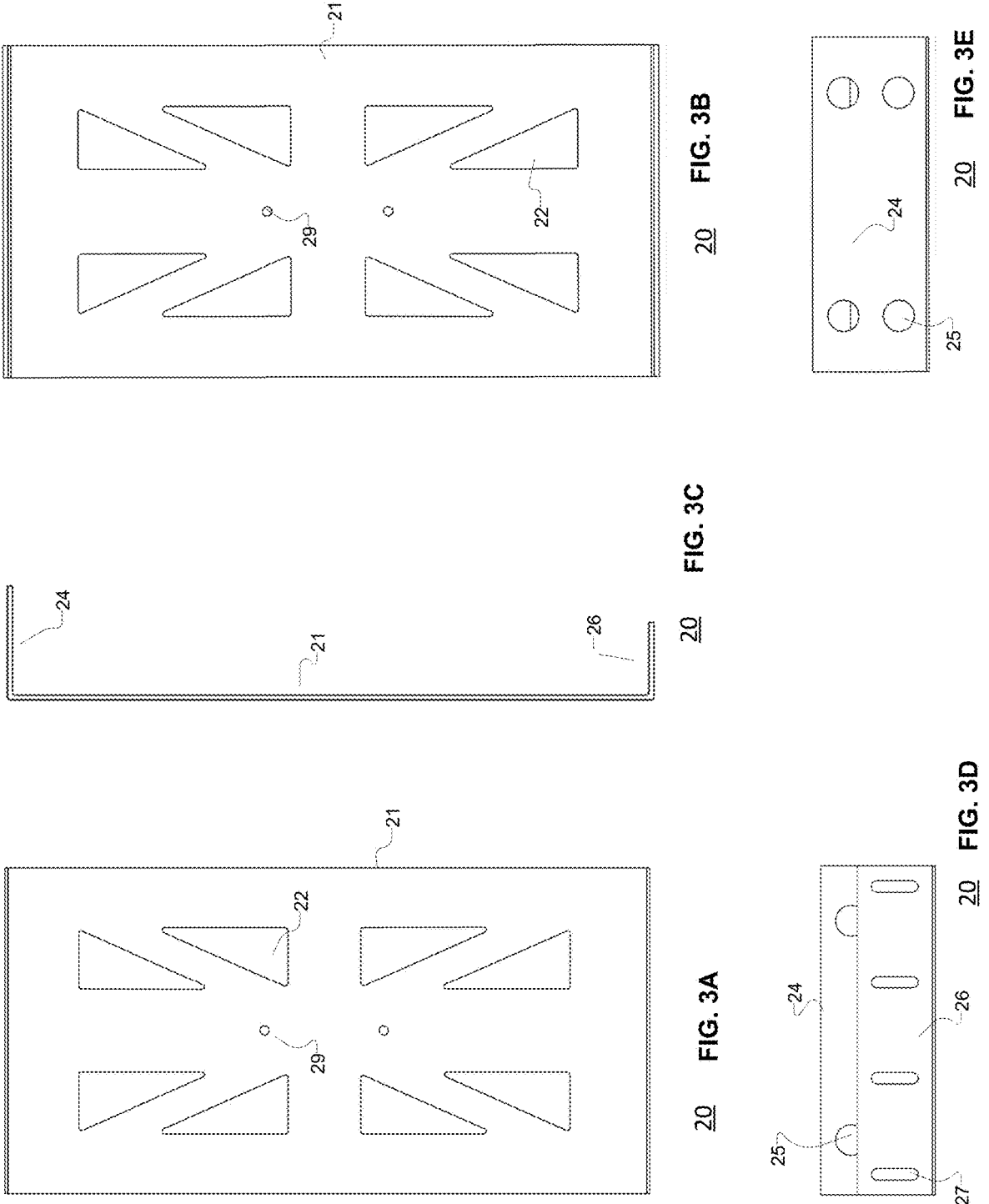
FIG. 3A is a simplified front view of a vertical support or arm of a bracket system in accordance with one or more embodiments of the present invention.
FIG. 3B is a simplified side view of an arm of a bracket system in accordance with one or more embodiments of the present invention.
FIG. 3C is a simplified back view of an arm of a bracket system in accordance with one or more embodiments of the present invention.
FIG. 3D is a simplified bottom view of an arm of a bracket system in accordance with one or more embodiments of the present invention.
FIG. 3E is a simplified top view of an arm of a bracket system in accordance with one or more embodiments of the present invention.

FIG. 3A is a simplified front view of a vertical support or arm 20 of a bracket system 10. FIG. 3B is a simplified side view of a vertical support/arm 20 of a bracket system 10. FIG. 3C is a simplified back view of a vertical support/arm 20 of a bracket system 10. FIG. 3D is a simplified bottom view of a vertical support/arm 20 of a bracket system 10 in accordance with one or more embodiments of the present invention. FIG. 3E is a simplified top view of a vertical support/arm 20 of a bracket system 10. As shown in FIGS. 3A-3E, the vertical support (or offset arm) 20 includes a substantially rectangular elongated body 21 with perforations 22, a cable tray (or rail) interface 24 and a component rack interface 26.

As shown in FIGS. 3A and 3B, the elongated body 21 includes fenestrations 29 sized and located to match the cross member's 30 interfaces 34 fenestrations so a linkage element 40 may securely couple the (left or right) vertical support 20 body 21 to the (left or right) interface 34 of a cross member 33 to form the bracket system 10. The perforations 22 in the vertical supports 20 may also enable or increase the flexibility of the support 20 and add visualize of the environment about the supports 20 of a bracket system 10 in an embodiment. As shown in FIG. 3D, a vertical support or offset arm 20 may include a component rack interface 26 having several parallel elongated fenestrations or slots 27 in an embodiment. The slots 27 may have a width to engage the bolt or head 42 of a linkage element 40 to secure the interface 26 to a component rack 50 fenestration (53 FIG. 4D). The slots 27 may be elongated in an embodiment to enable the interface 26 to engage/mate/align component racks having different fenestration registrations 53 or allow for tolerances in such fenestrations 53.

As shown in FIGS. 3D and 3E, a vertical support or offset arm 20 may include a cable tray interface 24 having several rows of larger fenestrations 25 (larger than the fenestrations 29 and slots 27 (width versus diameter)) in an embodiment. The fenestrations 25 may be sized to mate/align with larger fenestrations (66 FIG. 4D) of a cable tray 60. The larger fenestrations 25, 66 may allow the use of a quick release linkage element (90 FIG. 5) such as a detachable (or quick releasable) pin 90. Such fenestrations 25, 66, thus may enable a person to quickly decouple a cable tray 60 from the backet system 10 (vertical arm 20 interfaces 24) in order to enable movement of a component rack 50 also coupled to the bracket system 10. In an embodiment, the component rack interface 26 may have larger fenestrations 27 along with the component rack 50 fenestrations 53 to enable quick disconnection/decoupling of a bracket system 10 from a component rack 50.

Figure 4B:
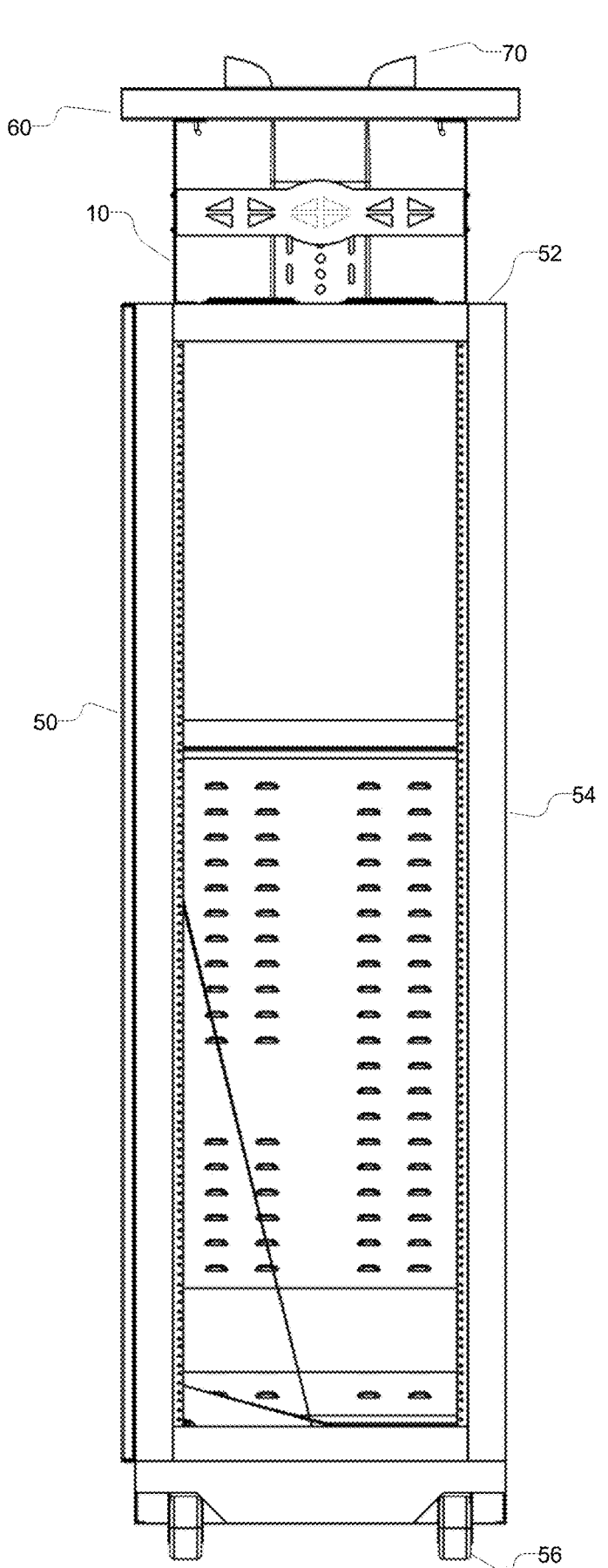
FIG. 4B is a simplified front view of a cable support architecture including a bracket system in accordance with one or more embodiments of the present invention.
Figure 4C:
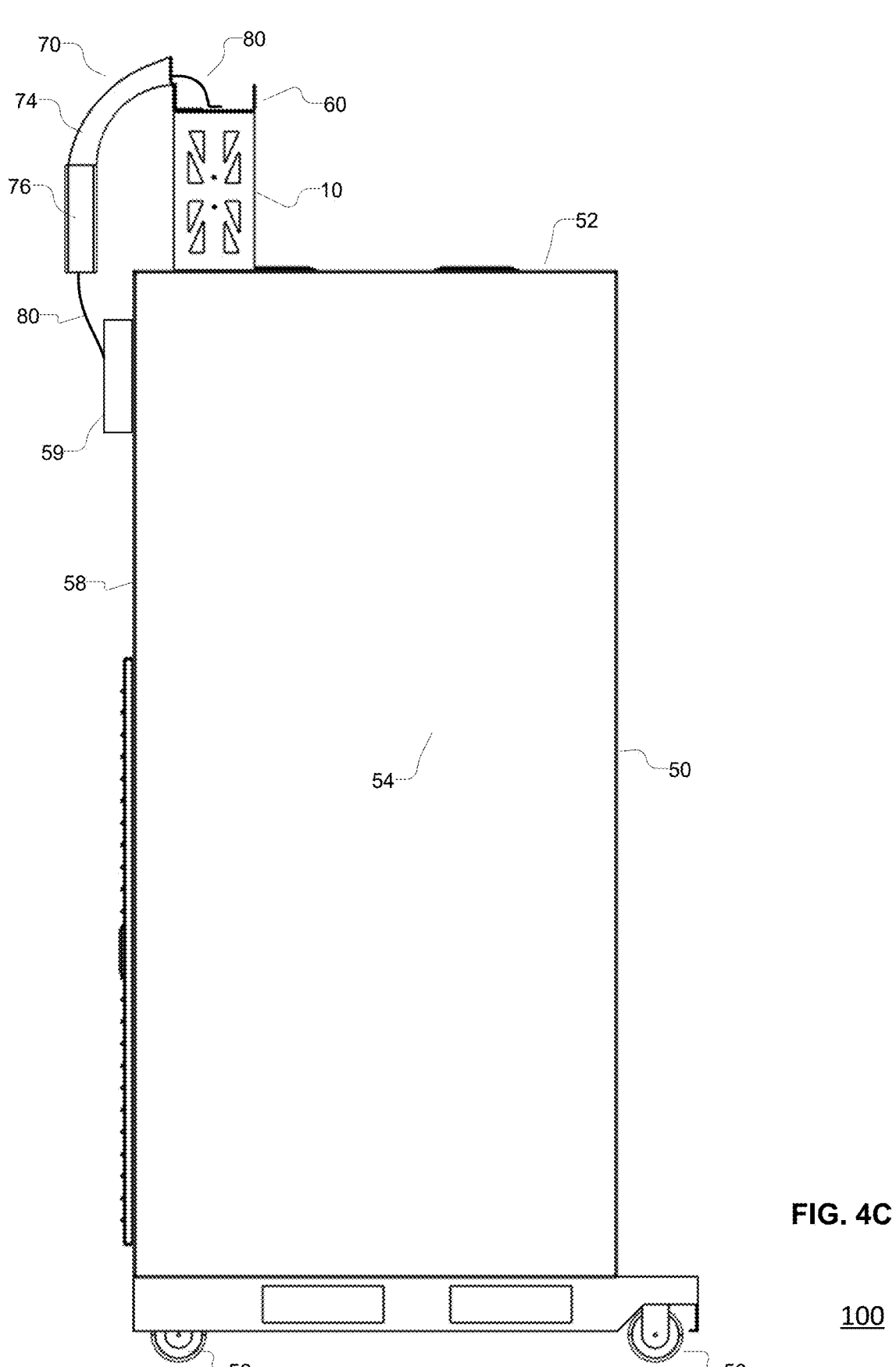
FIG. 4C is a simplified side view of a cable support architecture including a bracket system in accordance with one or more embodiments of the present invention.

As shown in FIG. 3C, the vertical support 20 interfaces 24, 26 form a 90-degree angle between the vertical member 20 elongated body 21 in an embodiment so the interfaces 24, 26 are orthogonal to the vertical support 20 elongated body 21. The length and height of the vertical support 20 may also vary depending on the component rack 50 and cable tray 60 to be engaged. In an embodiment, the vertical member 20 may have a width (along the body 21) of 6 inches, and height (vertical component of body 21) of 12 inches and also have a thickness of 0.090 inches. In an embodiment, the vertical support 20 may have a height of at least 9 inches to enable a person to be able to engage linkage elements 40 and 90 so a component rack 50 and a cable tray 60 may be reconfigured as desired. FIGS. 4A-4F are simplified isometric views of cabling support architecture 100 including a bracket system 10 in use in accordance with one or more embodiments of the present invention. FIG. 4A is a simplified isometric view of cabling support architecture 100. FIG. 4B is a simplified front view of cable support architecture 100. FIG. 4C is a simplified side view of cable support architecture 100.

As shown in FIG. 4A, architecture 100 may include a component rack 50, a bracket system 10, a cable tray 60, and a cable guide or waterfall 70 in an embodiment. In this embodiment, bracket system 10 vertically offsets the cable tray 60 and the waterfall 70 from the top 52 of the component rack 50. As shown in FIG. 4A, the component rack includes a body 54, wheels 56 for movement of the rack 50, a back 58, and a front 57 where components (51A, 51B FIG. 6A) may be inserted/installed therein. In an embodiment shown in FIG. 4C, a component rack may include a patch panel 59. Cables 80 being directed to a rack 50 via a cable tray 60 and waterfall 70 via its guide arms 74, 76 may be coupled (electrically or optically) to the patch panel 59. As shown in FIG. 4C, the patch panel 59 may be coupled to the back 58 of the component rack 50.

Figure 4D:
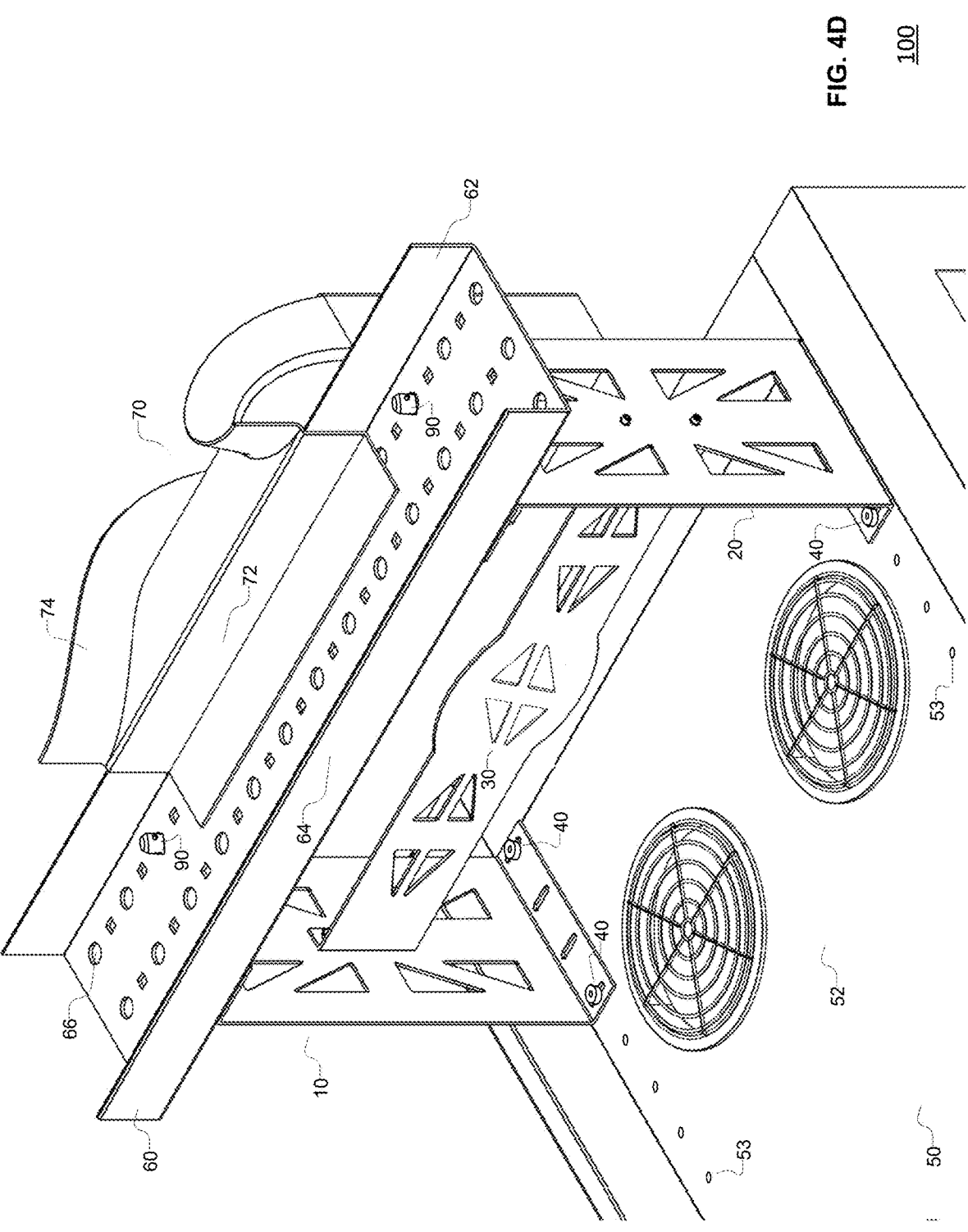
FIG. 4D is a simplified enlarged isometric view of a segment of a cabling support architecture including a bracket system in accordance with one or more embodiments of the present invention.
Figure 4E:
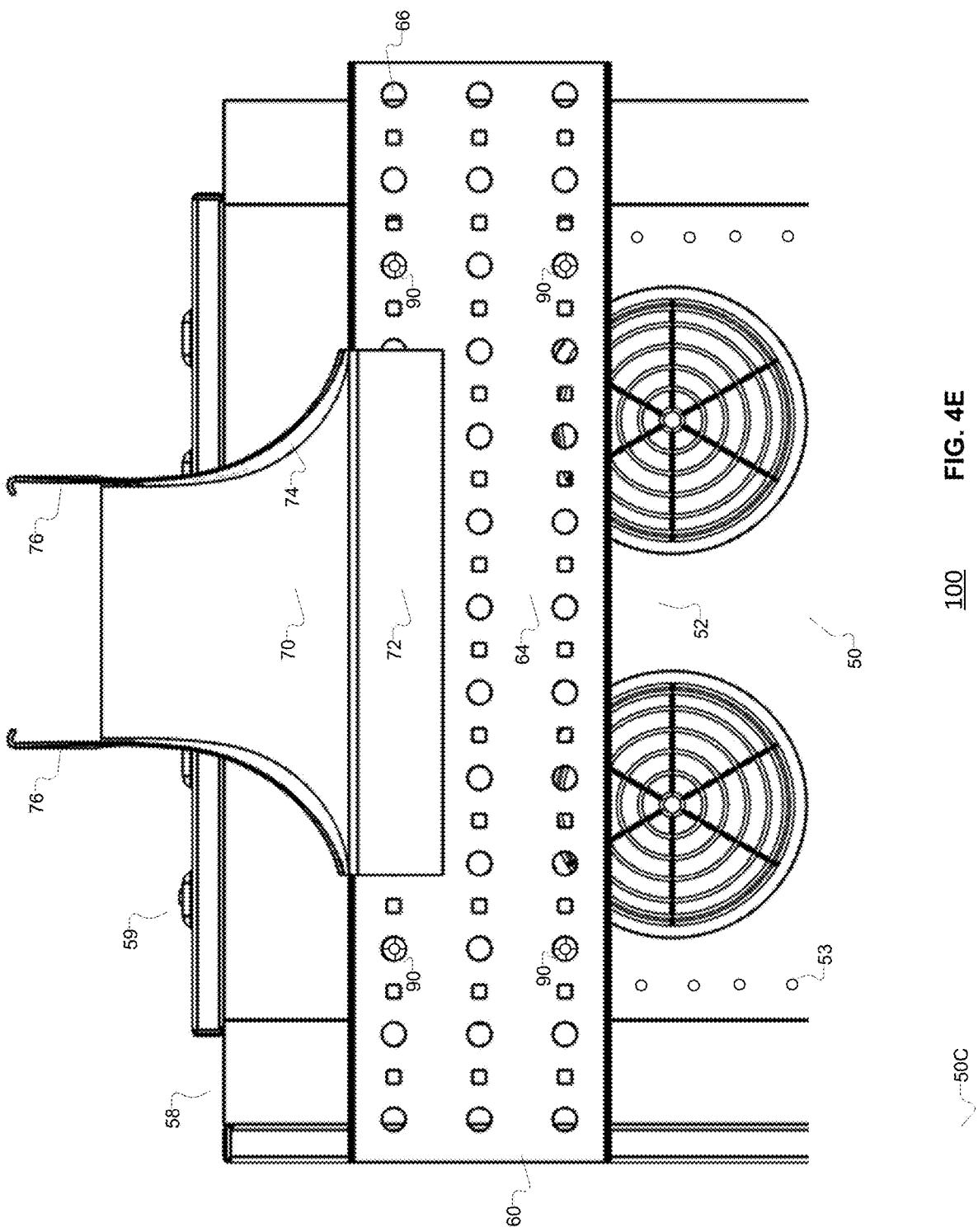
FIG. 4E is a simplified enlarged top view of a segment of a cabling support architecture including a bracket system in accordance with one or more embodiments of the present invention.
Figures 4F, 5:
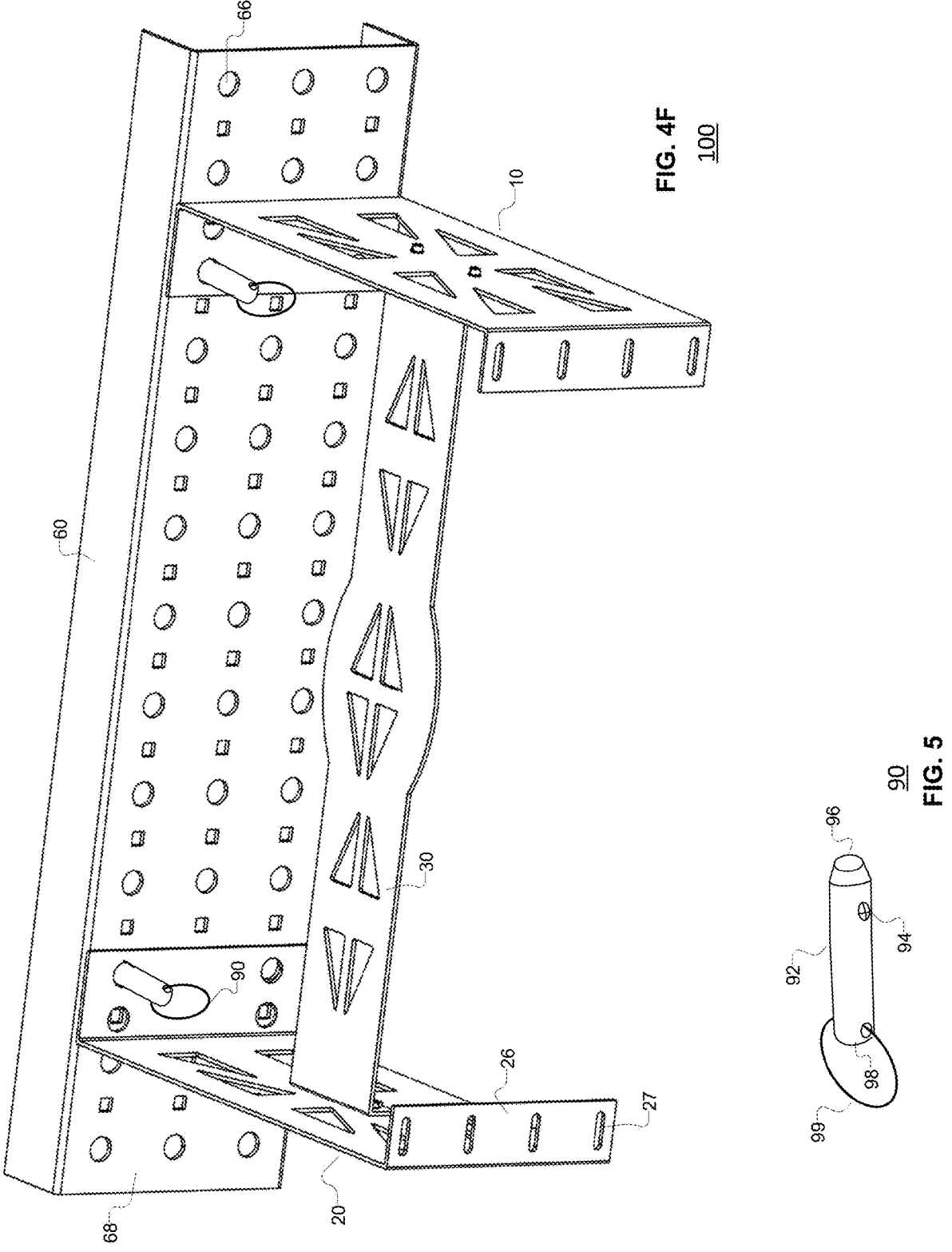
FIG. 4F is a simplified bottom view of a segment of a cabling support architecture including a bracket system in accordance with one or more embodiments of the present invention.
FIG. 5 is a simplified isometric view of a coupling mechanism that may be employed in a cable support architecture in accordance with one or more embodiments of the present invention.

FIG. 4D is a simplified enlarged isometric view of a segment of a cabling support architecture 100. FIG. 4E is a simplified enlarged top view of a segment of a cabling support architecture 100. As shown in FIGS. 4D-4E, a component rack top 52 may have spaced apart, parallel rows of openings or fenestrations 53 that may be threaded to accept a bolt or require a mating nut below. As noted, the fenestrations 53 in an embodiment may also accept a quickly releasable linkage element 90 as shown in FIG. 5. The cable tray 60 may have an elongated substantially rectangular body 64 with raised (vertical) sides 62 to route cables 80 therein. The base of the cable tray 60 may include continuous, parallel rows of larger circular fenestrations/openings 66. In an embodiment, the fenestrations 66 may be sized to enable the head 96 and shaft 92 of detachable pin 90 to pass throughout via engaging a deflectable detent 94 with the shaft 92 (see FIG. 5).

In an embodiment, the bracket system 10 vertical supports 20 lower interface 26 may be securely coupled to a component rack 50 via multiple linkage elements 40 inserted into slots 27 of the interface 26 and into the fenestrations 53 of the top of the component rack 50. In an embodiment, the bracket system 10 vertical supports 20 upper interface 24 may be securely, but releasably coupled to a cable tray 60 via multiple releasably linkage elements 90 inserted into fenestrations 25 of the interface 24 and into the fenestrations 66 within the elongated body 64 of the cable tray 60. FIG. 4F is a simplified bottom view of a segment of a cabling support architecture 100 of the bracket system 10 coupled to the cable tray 60. FIG. 4F shows how a linkage pin may extend below the bottom of cable tray 60 enabling easy access to a ring 99 coupled to the base 98 of the pin 90 to remove and insert the pin as desired. The bracket system 10 securely and vertically offsets the cable tray 60 from the top of the component rack while providing access to the releasable pins 90. Note that in an embodiment where the releasable pins 90 engage the component rack 50, the bracket system 10 may be rotated 180 degrees.

Figure 6A:
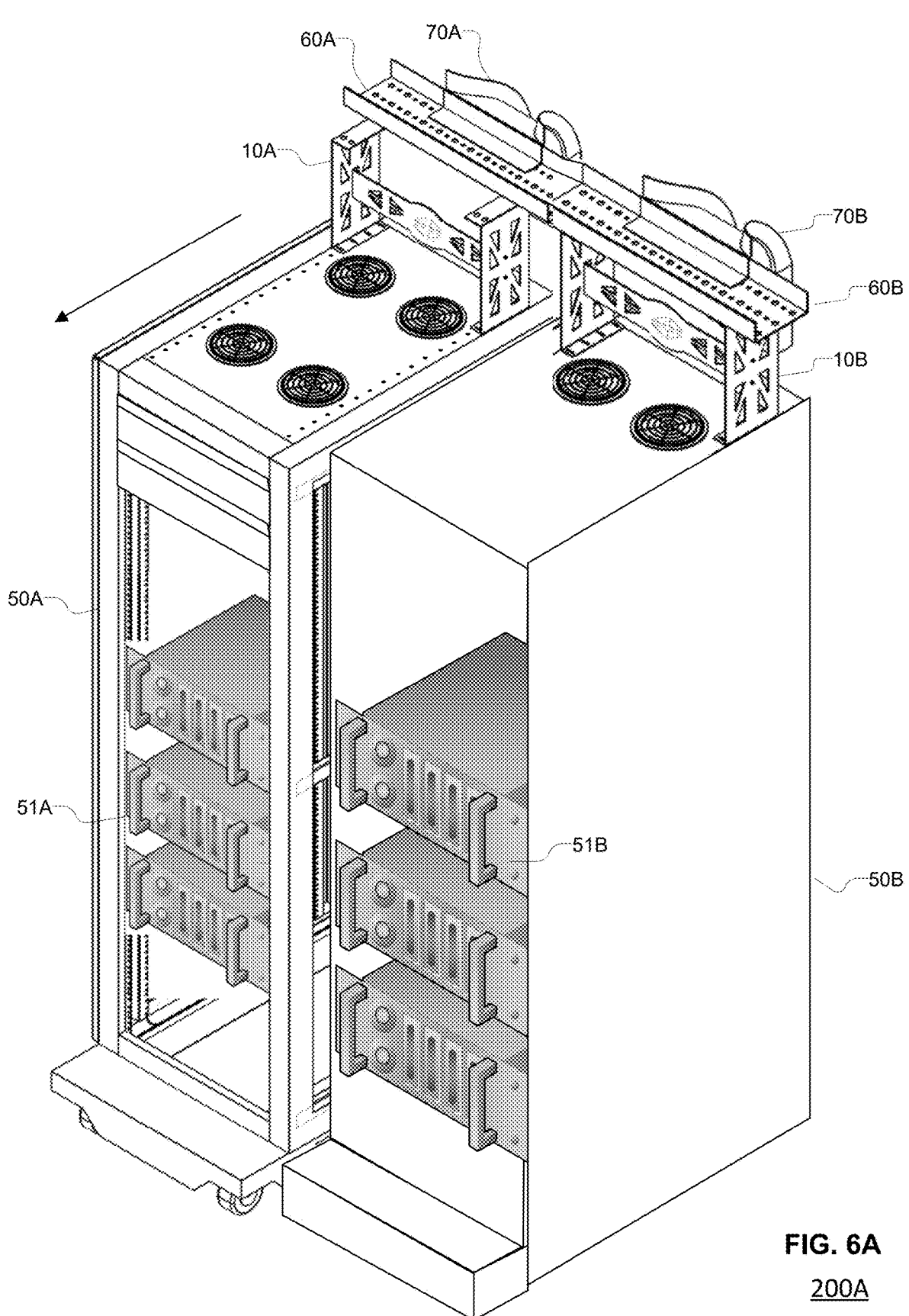
FIG. 6A is a simplified isometric view of a cabling support architecture including a component rack being moved in accordance with one or more embodiments of the present invention.

The addition of the bracket system 10 to a cabling system of component rack 50 using a cable tray 60 may ease the movement of the component rack when needed (such as for servicing or relocation, for example). FIG. 6A is a simplified isometric view of cabling support architecture 200A including a component rack 50A being moved in accordance with one or more embodiments of the present invention. As shown in FIG. 6A, the architecture includes multiple, adjacent component racks 50A, 50B (with components 51A, 51B installed therein) employing multiple bracket systems 10A, 10B to vertically offset cable trays 60A, 60B from the respective component racks 50A, 50B. In normal operation, the bracket systems 10A, 10B may be coupled to the component rack 50A, 50B and cable tray 60A, 60B. In an embodiment, a cable tray 60 may span across several component racks 50A, 50B and multiple bracket systems 10A, 10B may be coupled to this single cable tray 60. When a component rack 50A is to be moved, cables (80 FIG. 4C) may be disconnected from the cable patch board 59. The bracket system 10A may be decoupled from the cable tray 60A by removing any inserted pins 90 coupling the bracket system 10A vertical supports 20 to the cable tray 60. Once the pins 90 are removed, then component rack 50A may be moved horizontally with components 51A inserted therein. As shown in FIG. 6A, the bracket system 10A could remain securely coupled to the component rack 50A. It is noted once the component rack is moved sufficiently, the linkage 40 coupling the bracket system 10A to the component rack 50A may also be more easily removed to enable removal of the bracket system 10 if desired.

Figure 6B:
FIG. 6B is a simplified isometric view of a cabling support architecture including a component rack being moved in accordance with one or more embodiments of the present invention.

FIG. 6B is a simplified isometric view of another cabling support architecture 200B including a component rack 50A being moved in accordance with one or more embodiments of the present invention. In architecture 200B, the bracket system 10A may be decoupled from the component rack 50A by removing any inserted pins 90 coupling the bracket system 10A vertical supports 20 to the component rack 50A. Once the pins 90 are removed, then component rack 50A may be moved horizontally with components 51A inserted therein. As shown in FIG. 6B, the bracket system 10A could remain securely coupled to the cable tray 60A. It is noted once the component rack is moved sufficiently, the linkage 40 coupling the bracket system 10A to the cable tray 60A may also be more easily removed.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A bracket system for use in a system including a moveable component rack receiving one or more cables via a cable tray having a longitudinal axis above the component rack for cables to be routed along the cable tray longitudinal axis, and a lateral axis perpendicular to the longitudinal axis, and a plurality of fenestrations along its longitudinal axis, the bracket system including: a first vertical support including a first elongated body sized to provide a first offset from the cable tray vertically from a top of the component rack when inserted between the cable tray and the component rack and including a first interface on a first end with the cable tray that is releasably lockable with one of the plurality of fenestrations of the cable tray and a second interface on a second end with the top of the component rack that is releasably lockable with the top of the component rack, the first elongated body of the first vertical support extending along the lateral axis and a second vertical support including a second elongated body sized to provide a second offset from the cable tray vertically from a top of the component rack when inserted between the cable tray and the component rack and including a first interface on a first end with the cable tray that is releasably lockable with one of the plurality of fenestrations of the cable tray and a second interface on a second end with the top of the component rack that is releasably lockable with the top of the component rack, the second elongated body of the second vertical support extending along the lateral axis and separated from the first vertical support along the longitudinal axis, wherein the first offset, second offset, and separation are sufficient to enable a user to access and manipulate the first and the second interfaces of both the first vertical support and the second vertical support, wherein the first offset is sufficient to enable a user to access and manipulate the first and the second interfaces.

2. The bracket system of claim 1, wherein the cable tray has a fixed width along its longitudinal axis and the first elongated body of the first vertical support having a width along its lateral axis approximately the same width as the cable tray and the second elongated body of the second vertical support having a width along its lateral axis approximately the same width as the cable tray.

3. The bracket system of claim 2, wherein the component rack top includes a plurality of fenestrations and the first vertical support second interface includes a fenestration and the bracket system includes a releasably linkage element, wherein the releasably linkage element releasably and securely couples the top of the component rack via one of its plurality of fenestrations with the second interface fenestration.

4. The bracket system of claim 1, further including a cross member coupling the first vertical support with the second vertical support along the longitudinal axis.

5. The bracket system of claim 1, wherein the cable tray has a fixed width along its longitudinal axis and the first elongated body of the first vertical support having a width along its lateral axis approximately the same width as the cable tray.

6. The bracket system of claim 2, wherein the component rack top includes a plurality of fenestrations and the second vertical support second interface includes a fenestration and the bracket system includes a releasably linkage element, wherein the releasably linkage element releasably and securely couples the top of the component rack via one of its plurality of fenestrations with the second interface fenestration.

7. The bracket system of claim 6, further including a cross member coupling the first vertical support with the second vertical support along the longitudinal axis.

8. The bracket system of claim 6, wherein the moveable component rack is capable of having a plurality of components installed therein and wherein at least one of the received one or more cables via a cable tray provides a signal for one of the plurality of installed components.

9. A bracket system for use in a system including a moveable component rack receiving one or more cables via a cable tray having a longitudinal axis above the component rack for cables to be routed along the cable tray longitudinal axis, and a lateral axis perpendicular to the longitudinal axis, the bracket system including a first vertical support coupled to a second vertical support by a cross member separating the first and the second vertical support horizontally along the longitudinal axis, each of the first vertical support and second vertical support each including an elongated body sized to equally offset the cable tray vertically from a top of the component rack when inserted between the cable tray and the component rack top and a first interface on a first end with the cable tray and a second interface on a second end with the component rack top, the elongated body of each of the first vertical support and the second vertical support extending along the lateral axis, wherein the first vertical support and the second vertical supports offsets and separation are sufficient to enable a user to access their interfaces, wherein the cable tray has a fixed width along its longitudinal axis and the first elongated body of the first vertical support having a width along its lateral axis approximately the same width as the cable tray and the second elongated body of the second vertical support having a width along its lateral axis approximately the same width as the cable tray.

10. The bracket system of claim 9, wherein each first interface is releasably couplable to the cable tray.

11. The bracket system of claim 10, wherein each second interface is releasably couplable to the component rack top.

12. The bracket system of claim 9, wherein each second interface is fixably couplable to the component rack top.

13. The bracket system of claim 12, wherein each first interface is releasably couplable to the cable tray.

14. The bracket system of claim 9, wherein the cable tray has a plurality of fenestrations and wherein each vertical support first interface includes a fenestration and the bracket system includes releasable linkage elements, wherein each releasably linkage element releasably couples the cable tray via one of its plurality of fenestrations with one of the first interface fenestrations.

15. The bracket system of claim 14, wherein the component rack top includes a plurality of fenestrations and each vertical support second interface includes a fenestration, wherein releasable linkage elements releasable and securely couple the component rack top via one of its plurality of fenestrations and one of the second interface fenestrations.

16. The bracket system of claim 9, wherein the component rack top includes a plurality of fenestrations and the bracket system further includes securable linkage elements, and wherein each securable linkage element securable couples the component rack top via one of its plurality of fenestrations to a fenestration in the vertical support second interface.

17. The bracket system of claim 16, wherein cable tray has a plurality of fenestrations and the bracket system includes releasable linkage elements, wherein each releasable linkage element releasably and securely couple the cable tray via one of its plurality of fenestrations and a first interface fenestration in the vertical support first interface.

18. The bracket system of claim 17, wherein the moveable component rack is capable of having a plurality of components installed therein and wherein at least one of the received one or more cables via a cable tray provides a signal for one of the plurality of installed components.

\* \* \* \* \*